United States Patent
Lee et al.

(10) Patent No.: US 6,930,658 B2
(45) Date of Patent: Aug. 16, 2005

(54) CONTRAST-ADJUSTABLE PANELS AND DISPLAYS VIA ORGANIC LIGHT-EMITTING DEVICES

(75) Inventors: Jiun-Haw Lee, Hsin Chu (TW); Chi-Chih Liao, Hsin Chu (TW); Peir-Jy Hu, Hsin Chu (TW)

(73) Assignee: RIT Display Corporation (TW)

( * ) Notice: Subject to any disclaimer, the term of this patent is extended or adjusted under 35 U.S.C. 154(b) by 0 days.

(21) Appl. No.: 10/434,270

(22) Filed: May 9, 2003

(65) Prior Publication Data

US 2003/0214240 A1 Nov. 20, 2003

(30) Foreign Application Priority Data

May 10, 2002 (TW) ........................................ 91109770 A
May 10, 2002 (TW) ........................................ 91109771 A

(51) Int. Cl.[7] ............................... G09G 3/30; H01J 1/62
(52) U.S. Cl. .......................... 345/77; 345/76; 313/503; 313/504; 315/169.3; 315/169.4
(58) Field of Search .............................. 345/76, 77, 63, 345/82, 83; 315/169.3, 193.4, 169.1, 169.4; 313/503, 504, 506, 507

(56) References Cited

U.S. PATENT DOCUMENTS

| | | | | |
|---|---|---|---|---|
| 5,153,756 A | * | 10/1992 | Ike | 349/116 |
| 2003/0048239 A1 | * | 3/2003 | Cok et al. | 345/55 |
| 2003/0075767 A1 | * | 4/2003 | Lannon et al. | 257/414 |
| 2004/0031966 A1 | * | 2/2004 | Forrest et al. | 257/79 |
| 2004/0032382 A1 | * | 2/2004 | Cok et al. | 345/82 |

\* cited by examiner

*Primary Examiner*—Tuyet Thi Vo
(74) *Attorney, Agent, or Firm*—Birch, Stewart, Kolasch & Birch, LLP

(57) ABSTRACT

A contrast-adjustable display via an organic light-emitting device includes a transparent substrate, a light-detectable unit, a current-detectable unit, an organic light-emitting unit, a driving unit and a controlling unit. The light-detectable unit for detecting an external light intensity is formed on the transparent substrate, and then generates a current intensity based on the external light intensity. The current-detectable unit for detecting the current intensity is connected to the light-detectable unit. The organic light-emitting unit is formed on the transparent substrate for generating light. The driving unit connects to and drives the light-detectable unit and organic light-emitting unit, respectively. The controlling unit is connected to the current-detectable unit, and controls the driving unit depending on the current intensity.

19 Claims, 3 Drawing Sheets

CONTRAST-ADJUSTABLE PANELS AND DISPLAYS VIA ORGANIC LIGHT-EMITTING DEVICES

BACKGROUND OF THE INVENTION

1. Field of Invention

The invention relates to a contrast-adjustable panel and display via an organic light-emitting device, and in particular, to a contrast-adjustable panel and display via an organic light-emitting device, which has an organic light-emitting diode and an organic or inorganic light-detectable unit formed on a substrate.

2. Related Art

In optoelectronic industries, compact electronic devices have resulted in that flat panel displays have become one of the major focuses of industry.

Recently, present examples of flat panel displays include plasma displays, liquid crystal displays (LCDs), electroluminescent displays, organic light-emitting displays, vacuum fluorescence displays, field emission displays, and electrochromic displays. Compared to other flat panel displays, organic light-emitting displays possess the advantages of self-emissive, full viewing angle, high power efficiency, easy manufacture, low cost, wide operation temperature, and rapid response. Therefore, organic light-emitting devices may become the major choice for flat panel display technology in the future.

However, since the organic light-emitting display is self-emissive, the contrast of a conventional reflection-type display is superior to that of the organic light-emitting display when the external light intensity is absolutely high. In more details, when the external light intensity is greater than the brightness of the display, the image shown on the display is unclear and unrecognizable. In contrary, when the external light intensity is less than the brightness of the display, the image shown on the display is harsh. Therefore, it is an important subjective of the invention to provide an organic light-emitting device, which is contrast-adjustable in accordance with the external light intensity.

In prior, a conventional liquid crystal display, as disclosed in U.S. Pat. No. 5,153,756, has employed a pair of liquid crystal cells for use in detection of the display contrast, and the detected results are fed back to control a drive voltage applied to the liquid crystal display so as to automatically regulate the drive voltage applied to the liquid crystal display panel to thereby effectively automatically control the display contrast to the optimum level. The contrast-adjustable technique, however, has not been applied to the organic light-emitting display technology.

SUMMARY OF THE INVENTION

In view of the above-mentioned problems, an objective of the invention is to provide a contrast-adjustable panel or display via an organic light-emitting device, which is low cost and simply manufactured. The contrast-adjustable panel or display via an organic light-emitting device of the invention has an organic light-emitting diode and an organic or inorganic light-detectable unit formed on the same substrate.

To achieve the above objective, a contrast-adjustable display via an organic light-emitting device of the invention includes a transparent substrate, a light-detectable unit, a current-detectable unit, an organic light-emitting unit, a driving unit, and a controlling unit. In this invention, the light-detectable unit is formed on the transparent substrate to detect an external light intensity and to generate a current intensity based on the external light intensity. The current-detectable unit is electrically connected to the light-detectable unit and detects the current intensity. The organic light-emitting unit is formed on the transparent substrate and is used for emitting light. The driving unit is electrically connected to the light-detectable unit and the organic light-emitting unit, respectively. Therefore, the light-detectable unit and the organic light-emitting unit are respectively driven by the driving unit. The controlling unit is electrically connected to the current-detectable unit and controls the driving unit according to the current intensity, which is detected by the current-detectable unit.

The invention also discloses a contrast-adjustable display via an organic light-emitting device, which includes a transparent substrate, a light-detectable unit, a first driving unit, a current-detectable unit, an organic light-emitting unit, a second driving unit, and a controlling unit. In this aspect, the light-detectable unit is formed on the transparent substrate to detect an external light intensity and to generate a current intensity based on the external light intensity. The current-detectable unit is electrically connected to the light-detectable unit to detect the current intensity. The organic light-emitting unit is formed on the transparent substrate and emits light. The first driving unit drives the light-detectable unit, and the second driving unit drives the organic light-emitting unit. The controlling unit is electrically connected to the current-detectable unit, and controls the second driving unit according to the current intensity.

In addition, the invention further discloses a contrast-adjustable panel via an organic light-emitting device, which includes a transparent substrate, a light-detectable unit, and an organic light-emitting unit. In this case, the light-detectable unit is formed on the transparent substrate to detect an external light intensity and to generate a current intensity based on the external light intensity. The organic light-emitting unit is formed on the transparent substrate and is used to emit light.

Since, the contrast-adjustable panel or display via an organic light-emitting device of the invention is contrast-adjustable in accordance with the external light intensity automatically, the contrast of the panel or display can be adjusted to a proper value. Thus, the panel or display can be operated easily. The contrast-adjustable panel or display via an organic light-emitting device of the invention has an organic light-emitting diode and an organic or inorganic light-detectable unit formed on the same substrate, so that the production cost of the panel or device is reduced, and the size of the entire panel or device is decreased to fit the trend toward light and compact electronic apparatuses.

BRIEF DESCRIPTION OF THE DRAWINGS

The invention will become more fully understood from the detailed description given in the hereinbelow illustration, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

For all displays, the value of contrast, which is equal to the brightness as the display turned on over the brightness as the display turned off, is a critical point for the resolution of the display and is defined as the following equation:

$$contrast = \frac{L_{sub,on} + R_{amb}}{L_{sub,off} + R_{amb}}$$

Wherein, $L_{sub,on}$ is the brightness of a pixel as it is turned on, $L_{sub,off}$ is the brightness of a pixel as it is turned off, and $R_{amb}$ is the brightness of external light, which enters the display and is reflected from the display.

According to the previous-mentioned equation, when the external light intensity grows higher, the value of contrast becomes smaller. Thus, the resolution of the display becomes worse. At this moment, if the brightness of the display is increased, the contrast of the display can be maintained in proper. In contrary, when the external light intensity gets weaker, the value of contrast is increased sharply. In this case, if the brightness of the display is decreased, the power loss is reduced and the image of the display would not be harsh to our eyes.

In general, an organic light-emitting panel or display has a light-emitting unit array, including a plurality of light-emitting units. Therefore, one light-emitting unit is described hereinbelow for illustrating a contrast-adjustable display via an organic light-emitting device of the invention.

Figure 1A:
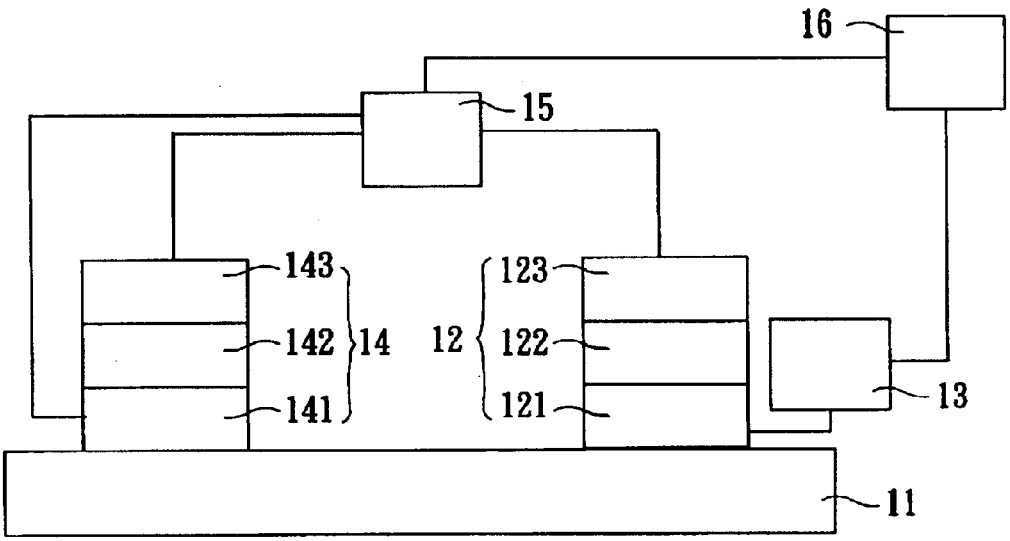
FIGS. 1A and 1B are schematic illustrations showing a contrast-adjustable display via an organic light-emitting device according to a preferred embodiment of the invention.
Figure 1B:
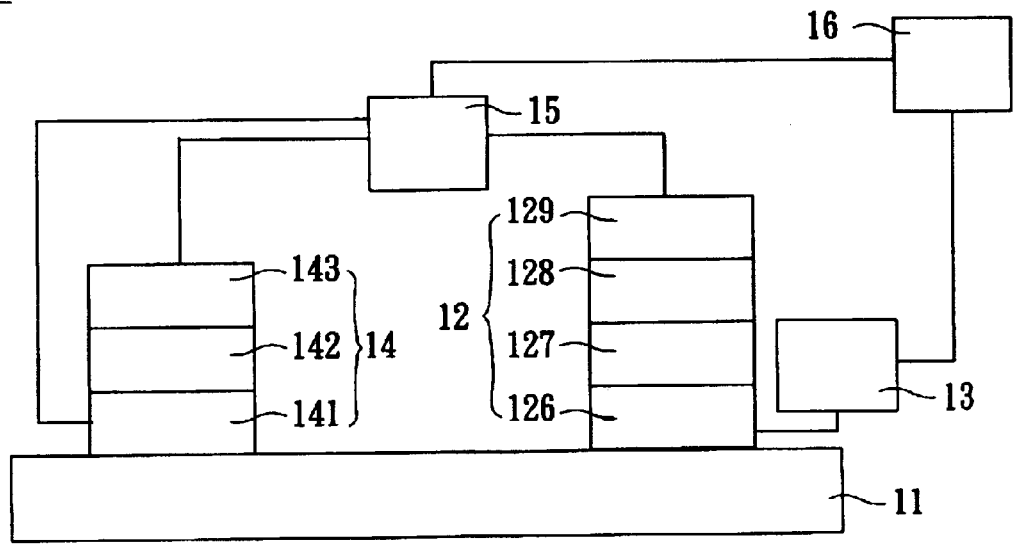

With reference to FIGS. 1A and 1B, a contrast-adjustable display via an organic light-emitting device 1 includes a transparent substrate 11, a light-detectable unit 12, a current-detectable unit 13, an organic light-emitting unit 14, a driving unit 15, and a controlling unit 16.

The transparent substrate 11 can be a glass substrate, a plastic substrate or a flexible substrate. In this embodiment, the plastic substrate or the flexible substrate is a polycarbonate (PC) substrate, a polyester (PET) substrate, a cyclic olefin copolymer (COC) substrate, or a metallocene-based cyclic olefin copolymer (mCOC) substrate.

The light-detectable unit 12 is formed on the transparent substrate 11 to detect an external light intensity. The light-detectable unit 12 further generates a current intensity according to the detected external light intensity. In this case, the external light intensity and the current intensity are in direct ratio. In more details, when the external light intensity detected by the light-detectable unit 12 is weak, the generated current intensity is relatively smaller; when the external light intensity detected by the light-detectable unit 12 is strong, the generated current intensity is relatively greater.

In the present embodiment, the light-detectable unit 12 is an organic light-detectable unit, which is consisted of a first electrode 121, an organic light-emitting layer 122, and a second electrode 123. The organic light-emitting layer 122 is sandwiched between the first electrode 121 and second electrode 123 (as shown in FIG. 1A). In this case, the first electrode 121 is a transparent electrode, and the second electrode 123 is a metallic electrode.

The organic light-emitting layer 122 may include a hole injecting layer, a hole transporting layer, a light-emitting layer, and an electron transporting layer. When charging the first electrode 121 and second electrode 123, the organic light-emitting layer 122 can transform the electric current into light. Alternatively, if the first electrode 121 and second electrode 123 are inverted, the organic light-emitting layer can retrieve external light and then generate an electric current. Thus, the organic light-detectable unit 12 can be used for light detection.

The first electrode 121 is a transparent cathode, which is made of a conductive metal oxide such as indium-tin oxide (ITO) or aluminum-zinc oxide (AZO). The second electrode 123 is a metallic anode, which is formed on the organic light-emitting layer 122 by method of evaporation or sputtering. The second electrode 123 is made of aluminum, aluminum/lithium fluoride, calcium, magnesium-silver alloys or silver.

Alternatively, the light-detectable unit 12 of a further embodiment can be an inorganic light-detectable unit. With referring to FIG. 1B, the inorganic light-detectable unit includes a transparent electrode 126, an n-type silicon layer 127, a p-type silicon layer 128, and a metallic electrode 129. The n-type silicon layer 127 and p-type silicon layer 128 are sandwiched in between the transparent electrode 126 and metallic electrode 129.

In this embodiment, the transparent electrode 126 is a transparent cathode, which is made of a conductive metal oxide such as indium-tin oxide (ITO) or aluminum-zinc oxide (AZO).

The n-type silicon layer 127 is consisting of silicon semi-conductive material, which is doped with phosphorus or arsenic. Thus, the n-type silicon layer 127 mainly includes a lot of negative electrons. In other words, free electrons are the major carriers in the n-type silicon layer 127, and holes are the minor carriers. The p-type silicon layer 128 is consisting of silicon semi-conductive material, which is doped with boron. Thus, the p-type silicon layer 128 mainly includes a lot of positive holes. In other words, holes are the major carriers in the p-type silicon layer 128, and free electrons are the minor carriers. As mentioned above, semi-conductive material made of pure silicon crystal doesn't consist other impurities, so that only few free electrons and holes can be generated at room temperature, and the conductivity of pure silicon crystal is undesirable. Thus, few impurities, such as phosphorus, arsenic or boron, are doped to increase the conductivity of the semi-conductive material.

The metallic electrode 129 is a metallic anode, which is formed on the p-type silicon layer 128 by method of evaporation or sputtering. The metallic electrode 129 is made of aluminum, aluminum/lithium fluoride, calcium, magnesium-silver alloys or silver.

The current-detectable unit 13 is electrically connected to the light-detectable unit 12, and detects the current intensity generated by the light-detectable unit 12.

With referring to FIGS. 1A and 1B, the organic light-emitting unit 14 is formed on the transparent substrate 11 for generating light. The organic light-emitting unit 14 includes a first electrode 141, a second electrode 143, and an organic light-emitting layer 142 sandwiched in between the first electrode 141 and second electrode 143. In the current embodiment, the first electrode 141 is a transparent anode, which is made of a conductive metal oxide such as indium-tin oxide (ITO) or aluminum-zinc oxide (AZO). The organic light-emitting layer 142 includes a hole injecting layer, a hole transporting layer, a light-emitting layer, and an electron transporting layer. The second electrode 143 is a metallic cathode, which is formed on the organic light-emitting layer 142 by method of evaporation or sputtering. The second electrode 143 is made of aluminum, aluminum/lithium fluoride, calcium, magnesium-silver alloys or silver.

The driving unit 15 is electrically connected to the light-detectable unit 12 and organic light-emitting unit 14, respectively. In the embodiment, the driving unit 15 includes a first driving portion and a second driving portion. The first driving portion drives the light-detectable unit 12 to detect the external light intensity, and the second driving portion drives the organic light-emitting unit 14 to emit light. In this case, the driving unit 15 is an active driving unit. Since the organic light-detectable unit is driven by an electron current, a switch TFT is employed as a switch for performing image data storage and locating. Furthermore, a drive TFT is used to modify a continuous current for driving the light-detectable unit according to a signal voltage stored in a storage capacitor. Alternatively, the driving unit 15 can also be a passive driving unit.

In the mentioned embodiments, since light can go through the transparent substrate 11, the light generated by the organic light-emitting unit 14 can pass through the transparent substrate 11 and be transmitted outward, and the light-detectable unit 12 can receive the external light for detection.

The controlling unit 16 is electrically connected to the current-detectable unit 13, and controls the second driving portion of the driving unit 15 according to the current intensity detected by the current-detectable unit 13.

In this embodiment, the light-detectable unit 12 detects the intensity of the external light, and then generates a current intensity. After that, the controlling unit 16 drives the driving unit 15 according to the current intensity. Next, the driving unit 15, which is controlled by the controlling unit 16, drives the organic light-emitting unit 14. Therefore, an organic light-emitting display can adjust the emission intensity itself automatically according to the external light intensity, and reaches proper contrast. In other words, when the external light intensity is greater, the brightness of the organic light-emitting display is increased automatically; when the external light intensity is smaller, the brightness of the organic light-emitting display is decreased automatically.

Figure 2A:
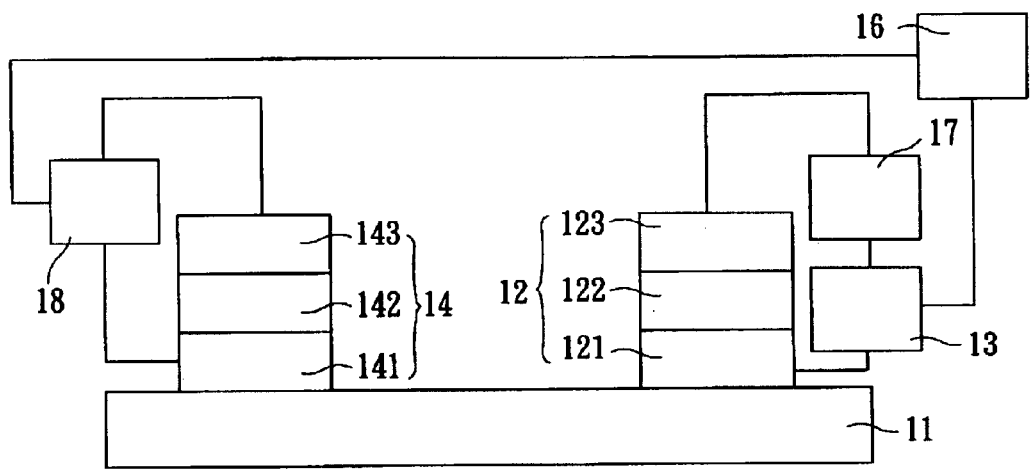
FIGS. 2A and 2B are schematic illustrations showing a contrast-adjustable display via an organic light-emitting device according to another preferred embodiment of the invention.
Figure 2B:
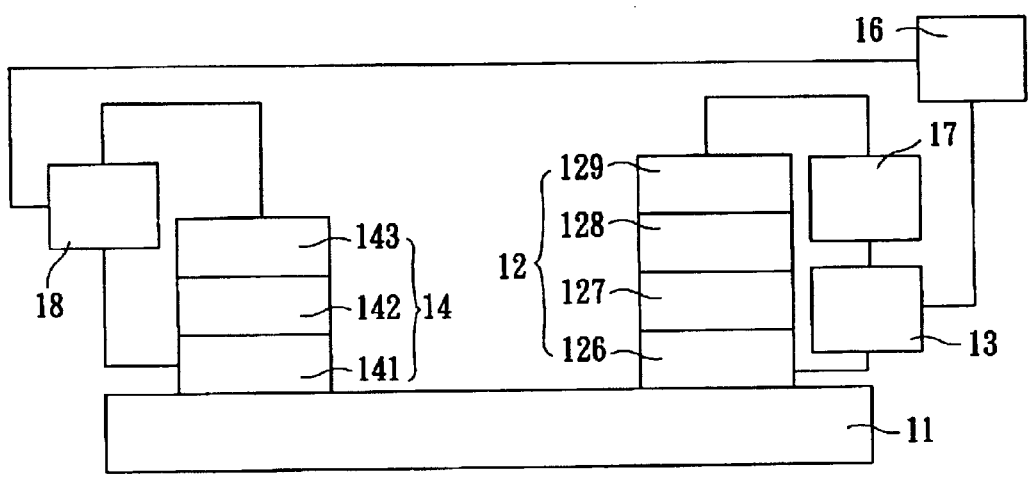

FIGS. 2A and 2B illustrate an additional preferred embodiment of the invention. In the present embodiment, the driving unit 15 is substituted with a first driving unit 17 and a second driving unit 18. The first driving unit 17 drives the light-detectable unit 12 to detect external light intensity. The second driving unit 18 drives the organic light-emitting unit 14 to emit light. In this case, the first driving unit 17 and second driving unit 18 can be active driving units or passive driving units. The light-detectable unit 12 can be an organic light-detectable unit or an inorganic light-detectable unit.

Figure 3A:
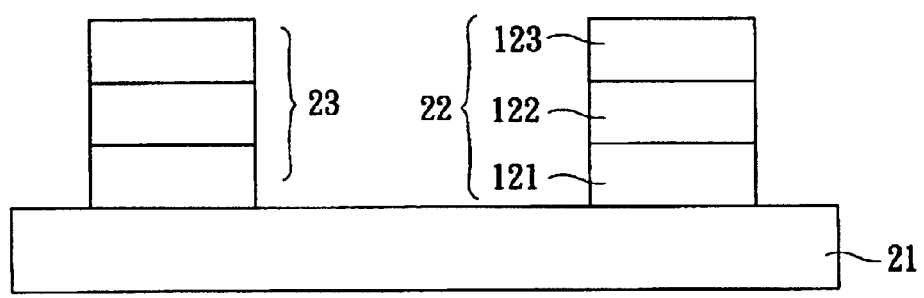
FIGS. 3A and 3B are schematic illustrations showing a contrast-adjustable panel via an organic light-emitting device according to a preferred embodiment of the invention.
Figure 3B:
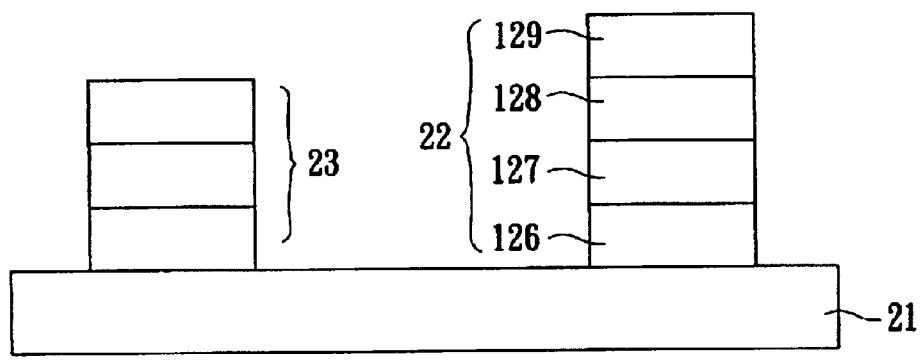

With reference to FIGS. 3A and 3B, a contrast-adjustable panel via an organic light-emitting device 2 according to a preferred embodiment of the invention includes a transparent substrate 21, a light-detectable unit 22, and an organic light-emitting unit 23. In this embodiment, the light-detectable unit 22 can be an organic light-detectable unit (as shown in FIG. 3A), or an inorganic light-detectable unit (as shown in FIG. 3B). The other units of the contrast-adjustable panel via an organic light-emitting device 2 are similar to those of the contrast-adjustable display via an organic light-emitting device 1, so that this specification would not illustrate it in more detail hereinbelow.

To sum up, since the contrast-adjustable display or panel via an organic light-emitting device of the invention employs an organic light-detectable unit or an inorganic light-detectable unit to detect external light intensity, the brightness of the display or panel can be automatically adjusted in accordance with the external light intensity. Thus, the contrast of the display or panel can be maintained within a preferred range. In the invention, the light-detectable unit and the organic light-emitting unit are formed on the same transparent substrate, so that the size of the entire panel or device is decreased. Moreover, the production cost of the panel or device is reduced, and the manufacturing processes of the panel or device are simplified.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A contrast-adjustable display via an organic light-emitting device, comprising:
    a transparent substrate;
    a light-detectable unit, which is formed on the transparent substrate, the light-detectable unit detecting an external light intensity and generating a current intensity according to the external light intensity;
    a current-detectable unit, which is connected to the light-detectable unit and detects the current intensity;
    an organic light-emitting unit, which is formed on the transparent substrate and emits light;
    a driving unit, which is respectively connected to the light-detectable unit and the organic light-emitting unit, and respectively drives the light-detectable unit and the organic light-emitting unit; and
    a controlling unit, which is connected to the current-detectable unit, and controls the driving unit according to the current intensity.

2. The display of claim 1, wherein the driving unit comprises:
    a first driving portion, which drives the light-detectable unit; and
    a second driving portion, which is controlled by the controlling unit and drives the organic light-emitting unit.

3. The display of claim 1, wherein the transparent substrate is a glass substrate.

4. The display of claim 1, wherein the transparent substrate is a plastic substrate.

5. The display of claim 1, wherein the transparent substrate is a flexible substrate.

6. The display of claim 1, wherein the light-detectable unit is an organic light-detectable unit.

7. The display of claim 6, wherein the organic light-detectable unit comprises two electrodes and an organic light-emitting layer sandwiched between the electrodes.

8. The display of claim 1, wherein the organic light-emitting unit comprises two electrodes and an organic light-emitting layer sandwiched between the electrodes.

9. The display of claim 1, wherein the driving unit is an active driving unit.

10. The display of claim 1, wherein the driving unit is a passive driving unit.

11. The display of claim 1, wherein the light-detectable unit is an inorganic light-detectable unit.

12. The display of claim 11, wherein the inorganic light-detectable unit comprises two electrodes, an n-type silicon layer, and a p-type silicon layer, the n-type silicon layer and the p-type silicon layer being sandwiched between the electrodes.

13. A contrast-adjustable display via an organic light-emitting device, comprising:

a transparent substrate;

a light-detectable unit, which is formed on the transparent substrate, the light-detectable unit detecting an external light intensity and generating a current intensity based on the external light intensity;

a first driving unit for driving the light-detectable unit;

a current-detectable unit, which is connected to the light-detectable unit and detects the current intensity;

an organic light-emitting unit, which is formed on the transparent substrate and emits light;

a second driving unit for driving the organic light-emitting unit; and a controlling unit, which is connected to the current-detectable unit, and controls the second driving unit according to the current intensity.

14. The display of claim 13, wherein the organic light-emitting unit comprises two electrodes and an organic light-emitting layer sandwiched between the electrodes.

15. The display of claim 13, wherein the light-detectable unit is an organic light-detectable unit.

16. The display of claim 15, wherein the organic light-detectable unit comprises two electrodes and an organic light-emitting layer sandwiched between the electrodes.

17. The display of claim 13, wherein the light-detectable unit is an inorganic light-detectable unit.

18. The display of claim 17, wherein the inorganic light-detectable unit comprises two electrodes, an n-type silicon layer, and a p-type silicon layer, the n-type silicon layer and the p-type silicon layer being sandwiched between the electrodes.

19. A contrast-adjustable panel via an organic light-emitting device, comprising:

a transparent substrate;

a light-detectable unit, which is formed on the transparent substrate, the light-detectable unit detecting an external light intensity and generating a current intensity based on the external light intensity wherein the light-detectable unit is an inorganic detectable unit, the inorganic light-detectable unit including two electrodes, an n-type silicone layer, and a p-type silicone layer, the n-type silicone layer and the p-type silicone layer being sandwiched between the electrodes; and an organic light-emitting unit, which is formed on the transparent substrate and emits light.

* * * * *